United States Patent [19]

Walker

[11] Patent Number: 4,890,021
[45] Date of Patent: Dec. 26, 1989

[54] NOISE SPIKE ELIMINATION CIRCUIT FOR PULSE WIDTH MODULATORS

[75] Inventor: Charles S. Walker, Seattle, Wash.
[73] Assignee: Honeywell Inc., Minneapolis, Minn.
[21] Appl. No.: 299,590
[22] Filed: Jan. 23, 1989
[51] Int. Cl.$^4$ .......................................... H02K 17/687
[52] U.S. Cl. ..................... 307/572; 307/570; 307/571; 307/246; 307/584; 307/520; 307/542
[58] Field of Search .................. 307/570, 571–575, 307/246, 584, 304, 300, 520, 542, 270

[56] References Cited

U.S. PATENT DOCUMENTS

| | | | |
|---|---|---|---|
| 4,423,341 | 12/1983 | Shelly | 367/570 |
| 4,445,055 | 4/1984 | Bete | 307/571 |
| 4,471,245 | 9/1984 | Janutka | 307/571 |
| 4,677,324 | 6/1987 | Ronan, Jr. et al. | 307/571 |

FOREIGN PATENT DOCUMENTS

| | | | |
|---|---|---|---|
| 0114923 | 7/1984 | Japan | 307/570 |
| 0069211 | 4/1986 | Japan | 307/571 |

*Primary Examiner*—Stanley D. Miller
*Assistant Examiner*—Nancy Thai
*Attorney, Agent, or Firm*—Whitham & Marhoefer

[57] ABSTRACT

A pulse width modulator is provided with circuitry to eliminate high frequency noise spikes in its output. This circuitry is effective to slow down the switching time of the MOSFET switching transistor, increase the rise time of the voltage across the catch diode and improve the high frequency characteristics of the output filter. These benefits are achieved by only a few number of components.

6 Claims, 6 Drawing Sheets 4,890,021

NOISE SPIKE ELIMINATION CIRCUIT FOR PULSE WIDTH MODULATORS

The Federal Government has rights in the invention disclosed herein pursuant to contract No. N00024-84-C-6098, awarded by the Department of Navy.

CROSS-REFERENCE TO RELATED APPLICATION

The subject matter of this application relates to an invention disclosed in copending application Ser. No. 07/299,508 filed Jan. 23, 1989, by Charles S. Walker for "MOSFET Turn-On/Off Circuit" and assigned to the assignee of this application (Honeywell File A25-12980. The disclosure of that application is incorporated herein by reference.

BACKGROUND OF THE INVENTION

1. Field of the Invention

This invention generally relates to voltage and current regulator circuits and, more particularly, to a circuit which eliminates noise spikes in pulse width modulators used in such regulator circuits.

2. Description of the Prior Art

Pulse width modulator (PWM) voltage regulators provide closely regulated voltage or current outputs with high electrical efficiency. They also generate high level, high frequency electrical noise, with frequency components typically in the 20 MHz range. Radiation at this frequency does not require wires for effective transmission. This radiation is undesirable for many reasons including interference with communications signals and easy detection by hostile forces. Because of the high levels and frequencies of the noise, effective spike suppression is difficult at best, if not impossible.

SUMMARY OF THE INVENTION

It is therefore an object of the present invention to provide an effective spike elimination circuit for pulse width modulators.

According to the invention, there is provided circuitry to eliminate high frequency noise spikes in the output of a pulse width modulator. This circuitry is effective to slow down the switching time of the MOSFET switching transistor, increase the rise time of the voltage across the catch diode and improve the high frequency characteristics of the output filter. These benefits are achieved by only a few number of components.

BRIEF DESCRIPTION OF THE DRAWINGS

The foregoing and other objects, aspects and advantages of the invention will be better understood from the following detailed description of a preferred embodiment of the invention with reference to the drawings, in which:

FIG. 3 is an oscillograph showing the voltage and current as the MOSFET switch in the voltage regulator turns on;

DETAILED DESCRIPTION OF A PREFERRED EMBODIMENT OF THE INVENTION

Figure 1:
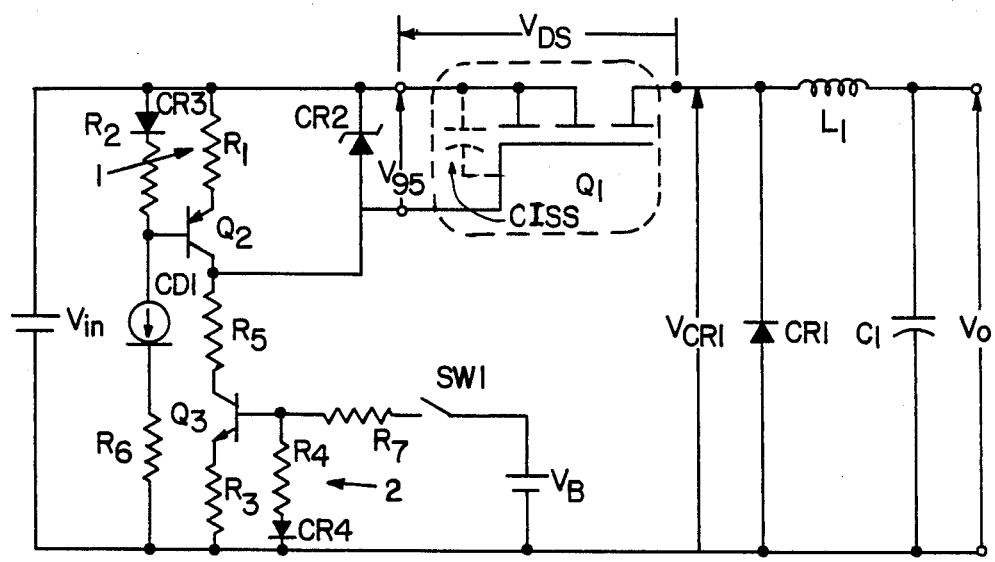
FIG. 1 is a schematic circuit diagram showing a buck-type voltage regulator which may be used in the practice of the invention.

Referring now to the drawings, and more particularly to FIG. 1, there is shown a pulse width modulator in which a dual current source is used to control a P-channel MOSFET switch $Q_1$. This circuit is the subject of my copending patent application Ser. No. 07/299,508 filed Jan. 23, 1989. The circuit includes a turn-off current generator 1 and a turn-on current generator 2. The turn-off current generator 1 comprises a resistor $R_2$ which, with diode $CR_3$, sets the base potential of PNP transistor $Q_2$. Diode $CR_3$ provides approximately 0.6 V drop and a negative temperature coefficient ($\approx -2$ mV/°C) to offset similar quantities in transistor $Q_2$. A current regulator diode $CD_1$ provides a constant current for resistor $R_2$ and diode $CR_3$. An optional resistor, $R_6$, may be connected in series with diode $CD_1$ to share the power loss with that diode. A dropping resistor, $R_1$, in the emitter circuit of transistor Qhd 2 sets the turn-off current level it off=$VR_2/R_1$. A Zener diode $CR_2$ limits the gate-to-source voltage of transistor $Q_1$ to approximately 8V.

The turn-on current generator 2 comprises an NPN transistor $Q_3$ having its collector connected to the collector of transistor $Q_2$ via an optional resistor $R_5$ which may be added to share the power loss with transistor $Q_3$. Resistor $R_4$, with bias voltage $V_B$ and resistor $R_7$, set the base potential of transistor $Q_3$. Resistor $R_7$ could be a current reference diode if $V_B$ is not a fixed voltage. Diode $CR_4$ provides a similar voltage drop and temperature coefficient function for transistor $Q_3$ as that provided by diode $CR_3$ for transistor $Q_2$. The emitter resistor, $R_3$, determines the turn-on current for transistor $Q_3$ in the same way as resistor $R_1$ does for transistor $Q_2$.

The high gain PNP transistor $Q_2$ and high gain NPN transistor $Q_3$ provide almost ideal current sources. Closing switch $SW_1$ turns on current source 2 which overpowers current source 1. The net current charges MOSFET $Q_1$ gate-to-source capacitance, $C_{iss}$, which, upon reaching the 2 to 4 volt threshold, turns on $Q_1$. When switch $SW_1$ is opened, current source 1 discharges $C_{iss}$ turning off $Q_1$.

Figure 2:
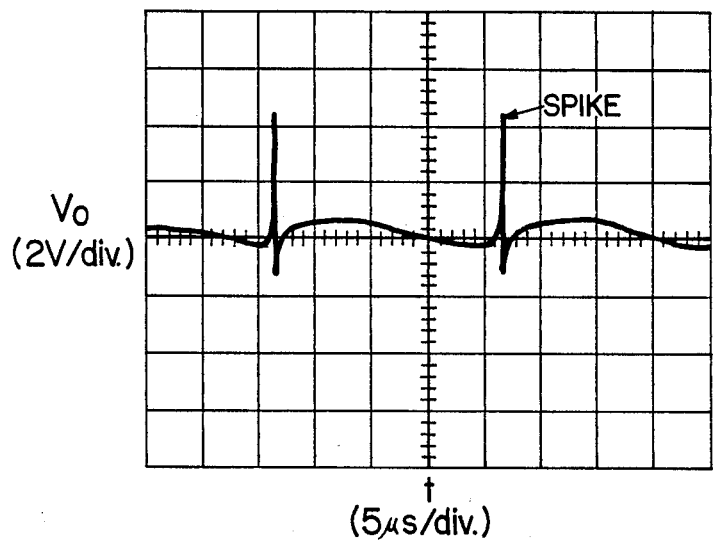
FIG. 2 is an oscillograph showing voltage spikes appearing across the output capacitor of the voltage regulator shown in FIG. 1.

A typical output voltage spike for this circuit is shown in FIG. 2. This is an oscillograph showing 2 to 4 volt spikes appearing across output capacitor $C_1$. High frequency "ring-down" is apparent. These voltage spikes are caused by three factors. They are (1) the fast $Q_1$ MOSFET switching time illustrated in FIG. 3, (2) the very fast catch diode $CR_3$ recovery time illustrated in FIG. 5, and (3) the non-ideal $L_1$, $C_1$ filter characteristics at high frequency illustrated in FIG. 7.

Figure 3:
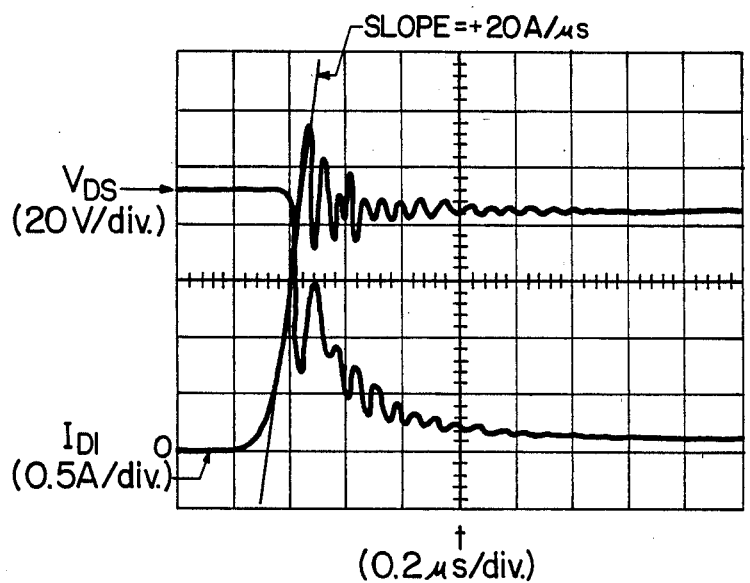

The oscillograph shown in FIG. 3 shows MOSFET $Q_1$ turning on. The drain current, $I_{D1}$, reaches a di/dt rate of 20A/μsec. The catch diode, $CR_1$, provides a path for inductor $L_1$ current when $Q_1$ is off. $Q_1$ first reduces the catch diode current to zero then provides the load current through $L_1$.

Figure 4:
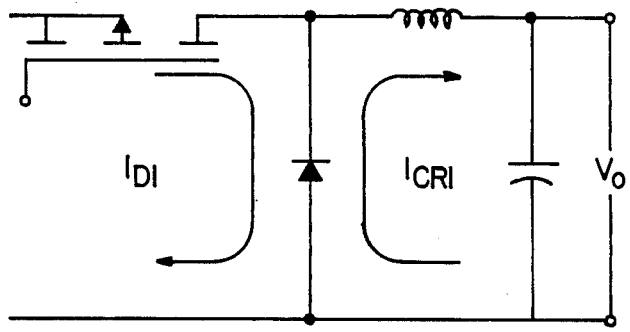
FIG. 4 is a schematic circuit diagram illustrating the currents in the catch diode connected in the output circuit of the MOSFET switch.
Figure 5:
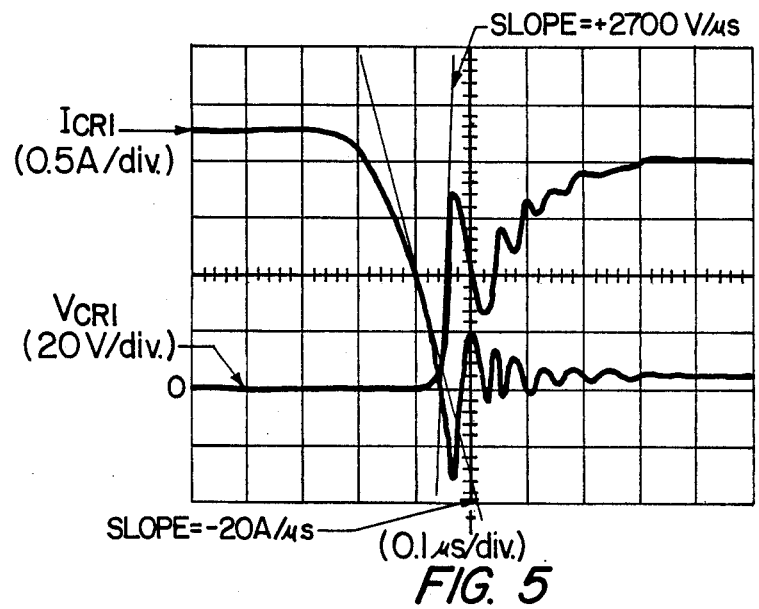
FIG. 5 is an oscillograph showing the voltage and current of the catch diode in the voltage regulator at switching.

FIG. 4 illustrates the loop currents $I_{D1}$ and $I_{CR1}$ through the catch diode $CR_1$. The oscillograph shown in FIG. 5 shows the catch diode current and voltage at switching. Apparent is the very fast diode voltage rise-time. It is this voltage that causes the output voltage spike. For very fast $CR_1$ voltage rise times, the filtering components $L_1$ and $C_1$ are only partially effective.

Figure 6:
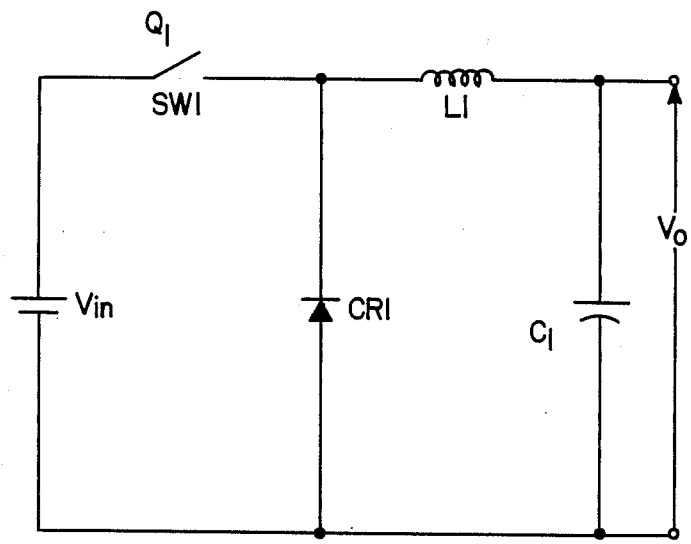
FIG. 6 is a schematic diagram showing the low frequency equivalent circuit of the catch diode and output filter circuit.
Figure 7:
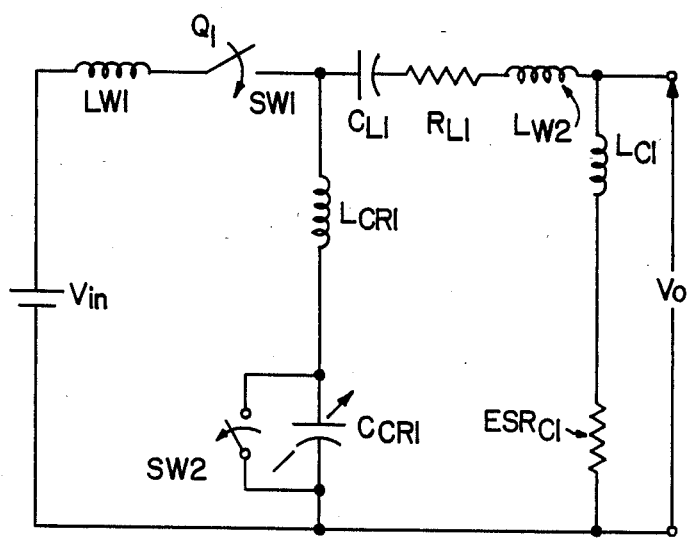
FIG. 7 is a schematic diagram showing the high frequency equivalent circuit of the catch diode and output filter circuit.

FIGS. 6 and 7 show the equivalent circuits for $L_1$, $C_1$ and the catch diode $CR_1$ at low and high frequencies, respectively. For the rise time produced by the $CR_1$ catch diode, the components, shown ideally in FIG. 6, actually become those shown in FIG. 7. Inductor $L_1$ becomes a capacitor due to interwinding capacitance, diode $CR_1$ becomes a variable capacitor, due to its junction diode characteristics, connected in series with its lead inductance, and $C_1$ becomes an inductor due to its lead inductance in series with a resistor, corresponding to the ESR of the capacitor. Finally, the connection leads provide series inductors $L_{W1}$ and $L_{W2}$. Switch $SW_2$ represents the "recovery" for $CR_1$. When this switch opens, the $Q_1$ current pours into $C_{CR1}$, rapidly increasing its voltage.

The foregoing analysis suggests several ways to eliminate the voltage spikes. First, slow down the switching time of $Q_1$. Second, make the voltage rise time of $CR_1$ longer; i.e., smaller dV/dt. Third, improve the high frequency characteristics of the output filter. These are implemented in the circuit shown in FIG. 8.

Figure 8:
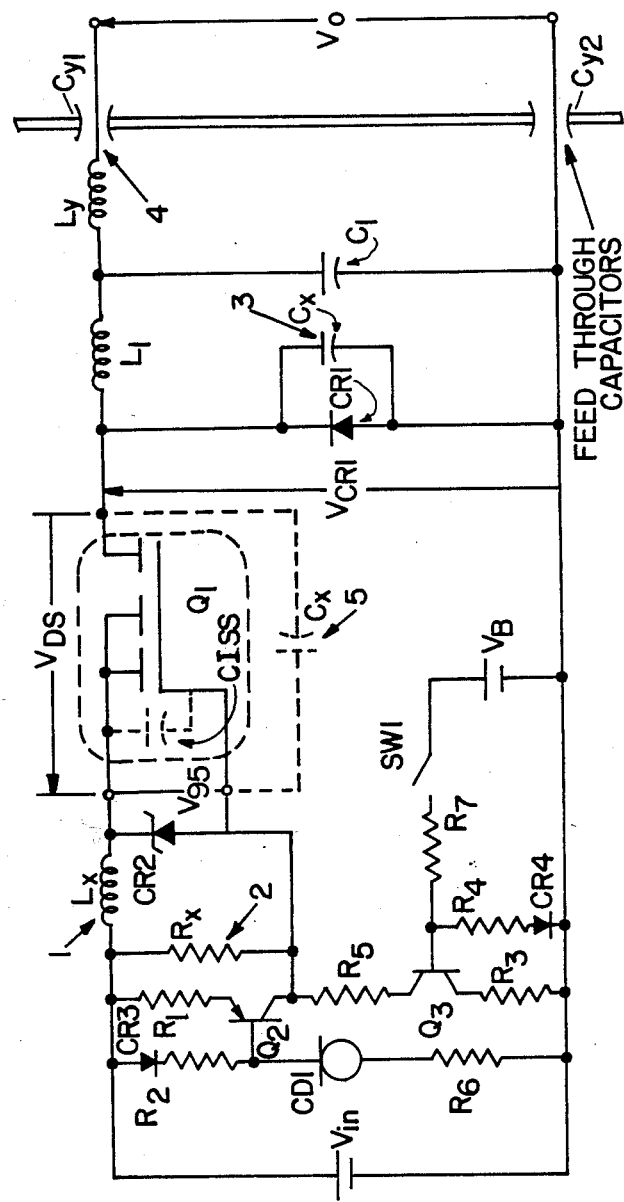
FIG. 8 is a schematic diagram of the voltage regulator circuit shown in FIG. 1 modified in an implementation of the present invention.

In FIG. 8, inductor $L_x$ is connected between the source of MOSFET $Q_1$ and the input voltage source $V_{in}$ and provides negative feedback to control di/dt. Resistor $R_x$ is connected between the collector of PNP transistor $Q_2$ and the input voltage source $V_{in}$ and establishes a voltage potential for $V_{Lx}$ to work against. Capacitor $C_x$ is connected across catch diode $CR_1$ and swamps the non-linear capacitance of the diode and slows the rise time by increasing the capacitance from 45pF to 1045pF. High frequency inductor/feedthrough capacitors $C_{y1}$ and $C_{y2}$ give additional filtering. Finally, capacitor $C_z$ may be optionally added if variations of the MOSFET $C_{iss}$ proves excessive. The addition of these six components reduces voltage spikes on the output of the PWM to negligible levels.

Figure 9:
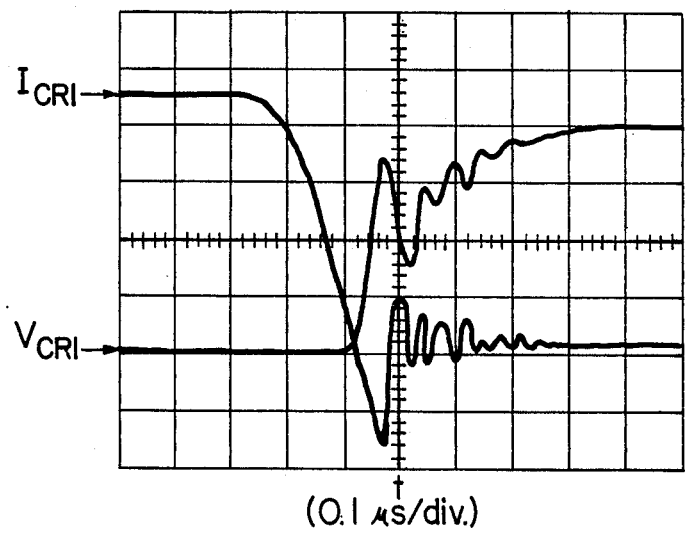
FIG. 9 is an oscillograph showing the catch diode voltage and current at switching before implementing the invention.
Figure 10:
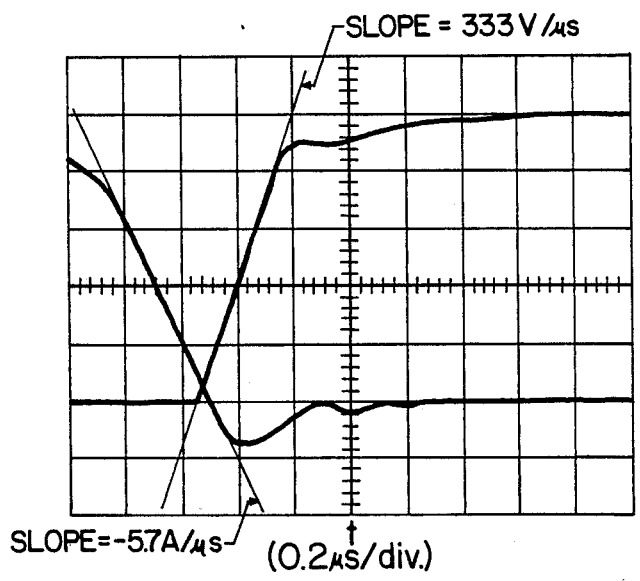
FIG. 10 is an oscillograph showing the catch diode voltage and current at switching after implementing the invention.
Figure 11:
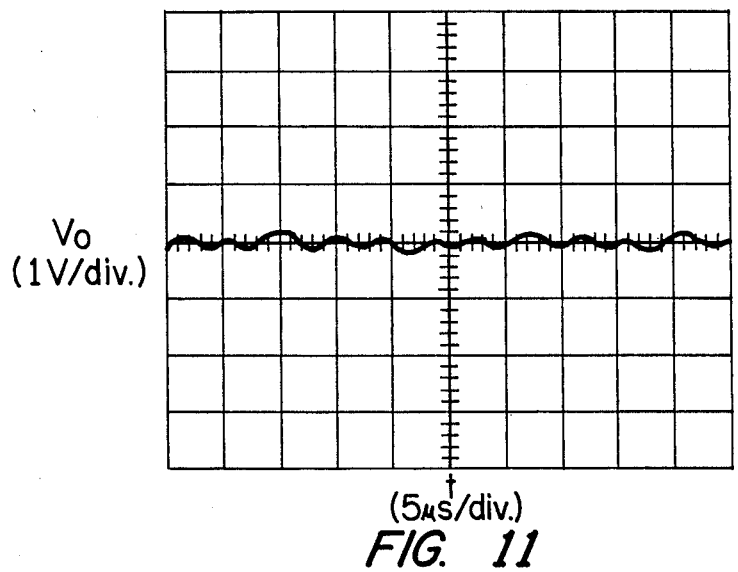
FIG. 11 is an oscillograph showing the output ripple voltage after implementing the invention.
Figure 1:
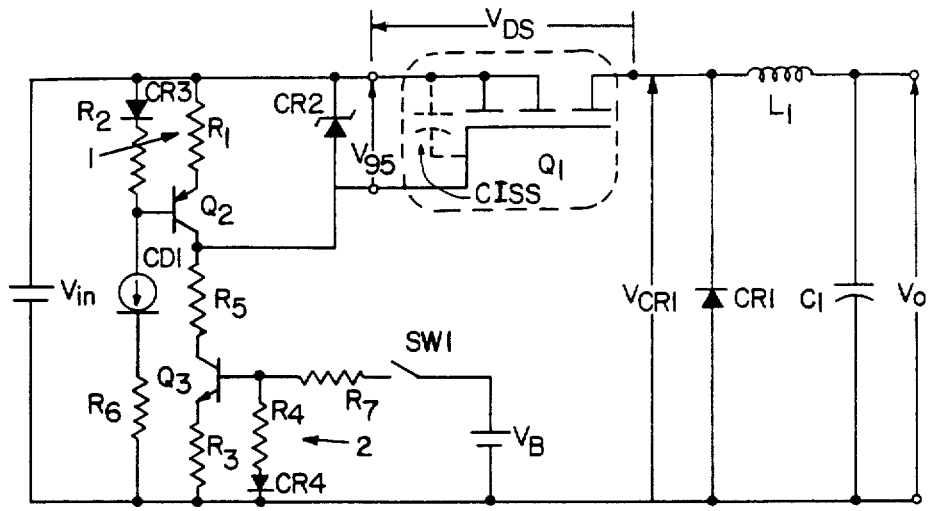
Figure 4:
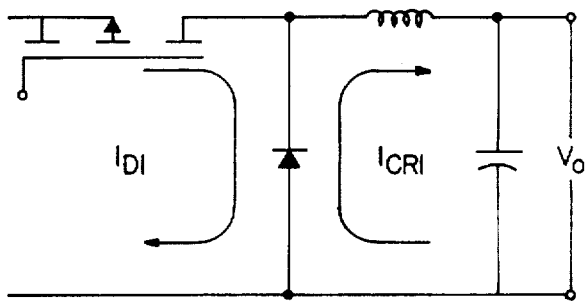
Figure 2:
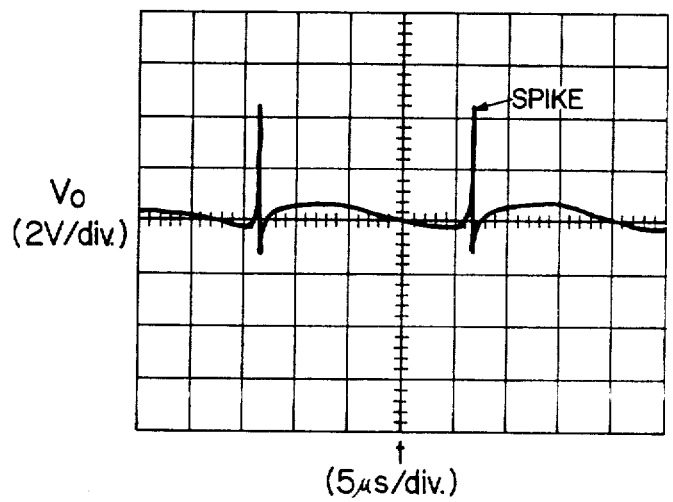
Figure 3:
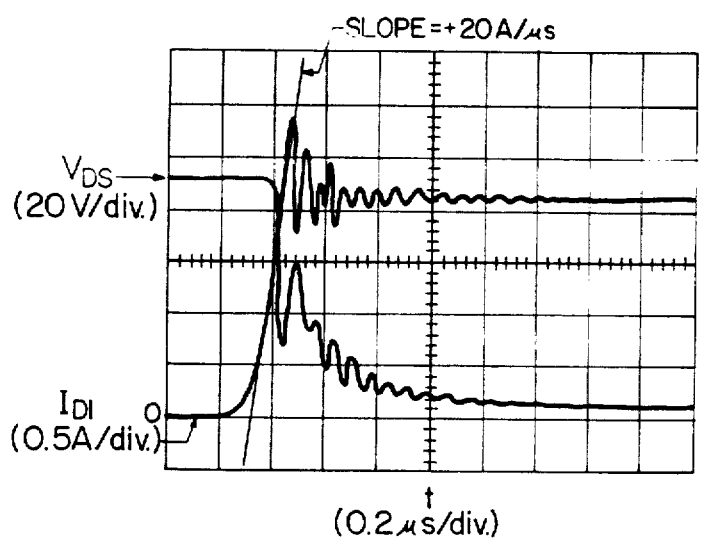
Figure 5:
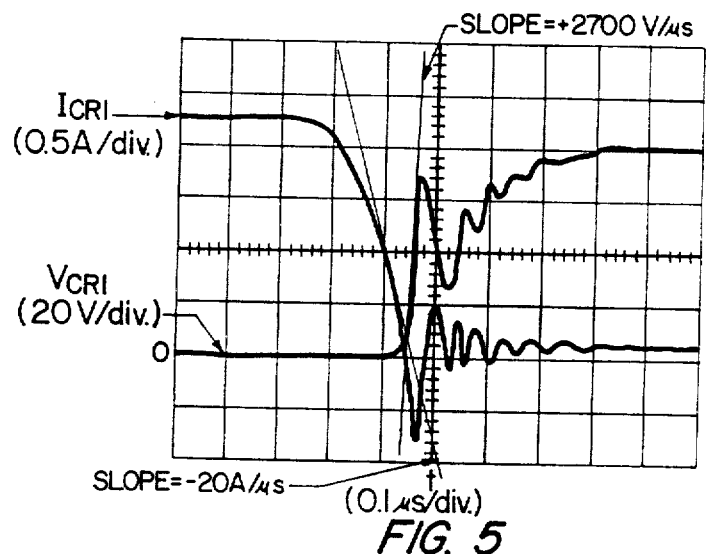
Figure 9:
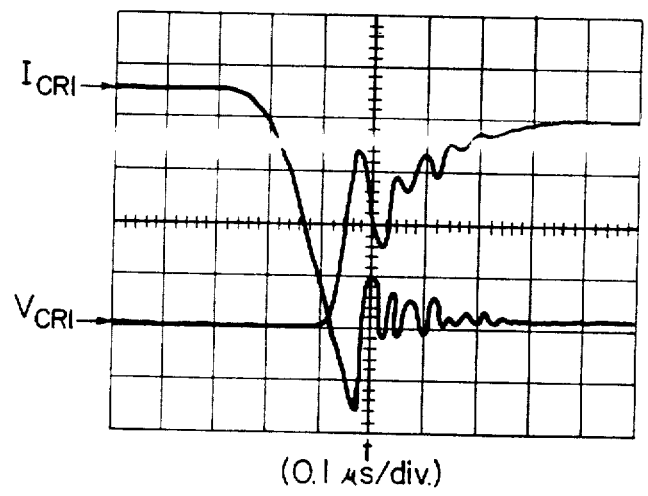
Figure 6:
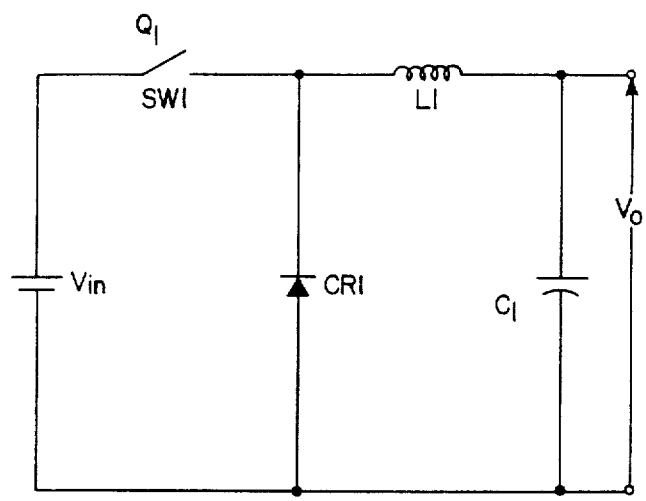
Figure 7:
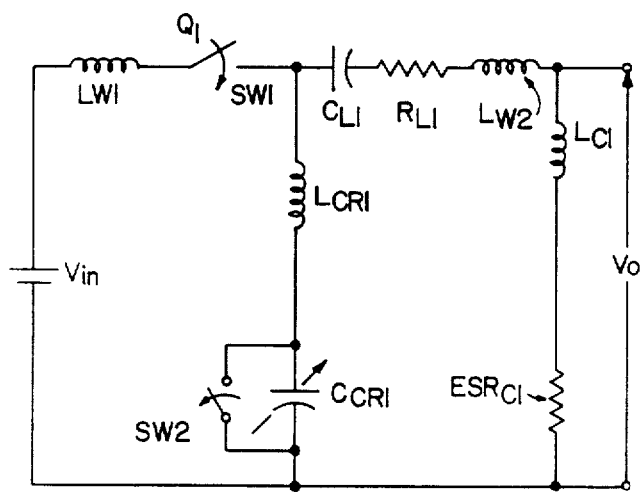
Figure 8:
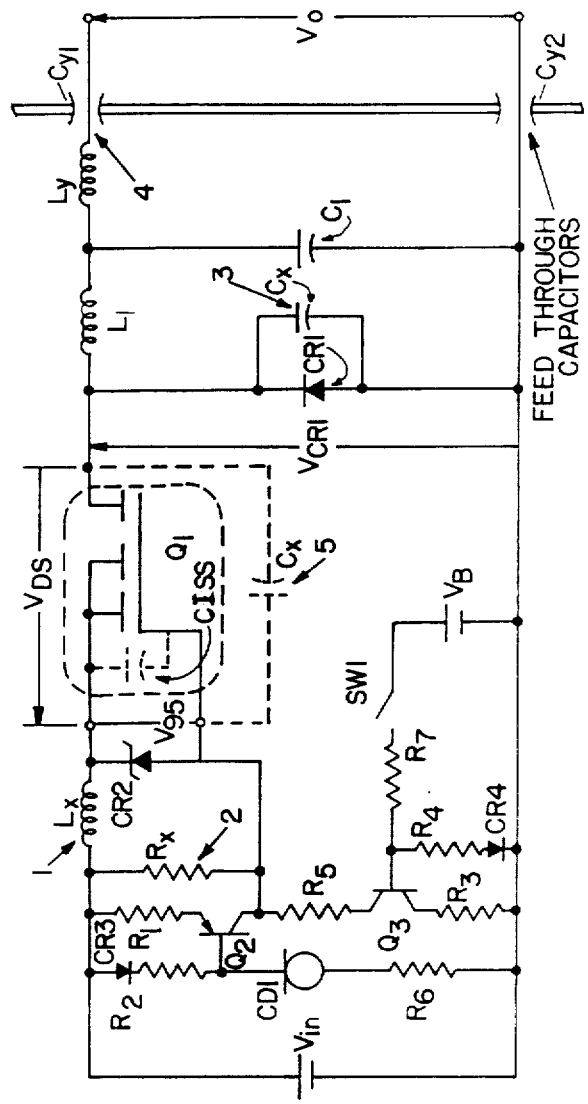
Figure 10:
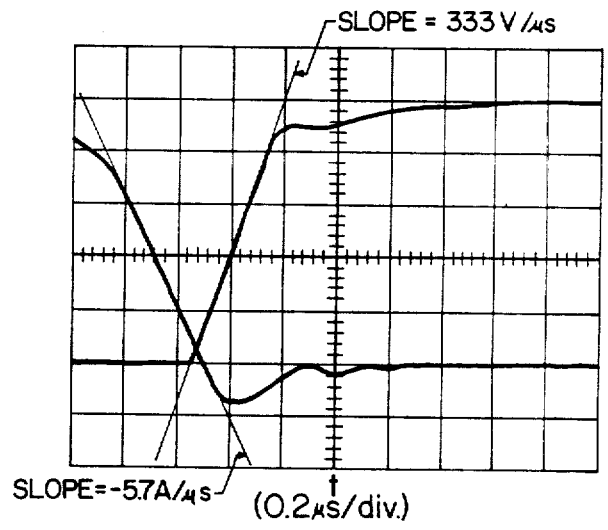
Figure 11:
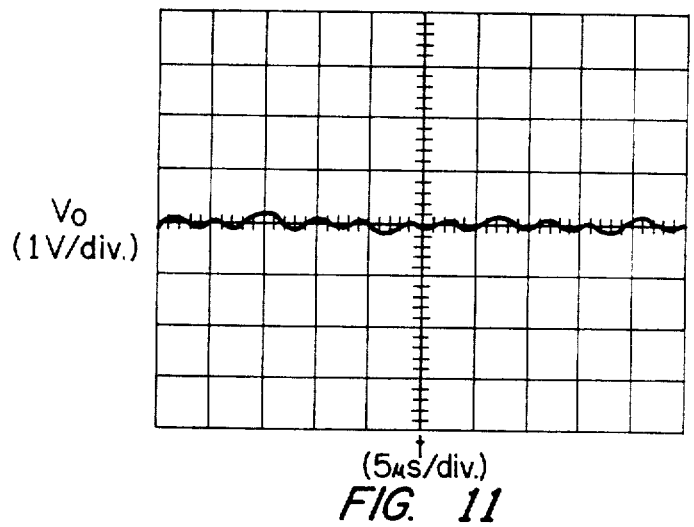

FIGS. 9 and 10 are before and after oscillographs of $V_{CR1}$ and $I_{CR1}$. $L_x$ and $C_x$ provide the desired results. $dI_{CR1}/dt$ has been reduced from −20 to −5.7A/μsec and $dV_{CR3}/dt$ from approximately 2,700 to 333 V/μsec. As shown in FIG. 10, the 10 MHz ringing has been eliminated. $L_y$, $C_{y1}$ and $C_{y2}$ are high frequency components. $L_y$ has a cut-off frequency of 125 MHz, well above the 10 to 20 MHz observed values in the circuit. Feed through capacitors $C_{y1}$ and $C_{y2}$ continue to provide attenuation beyond 1000 MHz. FIG. 11 shows the output ripple after the addition of $L_x$, $C_x$, $R_x$, $L_y$, $C_{y1}$ and $C_{y2}$.

The invention has successfully eliminated EMI producing voltage spikes by reducing rise times. The rise times are controlled by negative feedback. In addition, semiconductor parameter variation effects are reduced. These benefits are provided by only a few number of components and can be extended to PWM inverters. The slower turn-on/off times, however, do result in greater losses in MOSFET $Q_1$, but this can be accommodated by proper choice of the MOSFET switching transistors and heat sinks.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A dual current source MOSFET turn-on/off circuit including noise spike elimination comprising:
   a MOSFET connected between a voltage source and a filter and load;
   a turn-off current source comprising a first high gain bipolar transistor connected to a gate electrode of said MOSFET;
   a turn-on current source comprising a second high gain bipolar transistor connected in series with said first bipolar transistor;
   negative feedback means connected to said MOSFET for controlling the rate of change of current conducted by said MOSFET; and
   switch means connected to a base electrode of said second bipolar transistor for turning said second bipolar transistor on and off, said turn-on current source overpowering said turn-off current source when said second bipolar transistor is turned on to charge a gate-to-source capacitance of said MOSFET and said turn-off current source discharging said gate-to-source capacitance of said MOSFET when said second bipolar transistor is turned off.

2. The dual current source MOSFET turn-on/off circuit including noise spike elimination according to claim 1 further comprising:
   a diode connected across said filter and load; and
   capacitance means connected across said diode for swamping non-linear diode capacitance and slowing a rate of change in voltage by increasing said capacitance.

3. The dual current source MOSFET turn-on/off circuit including noise spike elimination according to claim 2 further comprising an inductor and feedthrough capacitors in series with said load providing additional high frequency filtering.

4. The dual current source MOSFET turn-on/off circuit including noise spike elimination according to claim 1 wherein said feedback means comprises:
   an inductor connected in series between said voltage source and said MOSFET; and
   a resistor connected in parallel with said PNP transistor and to said inductor for establishing a voltage potential for said inductor.

5. The dual current source MOSFET turn-on/off circuit including noise spike elimination according to claim 1 further comprising capacitor means connected across gate and drain electrodes of said MOSFET for stabilizing capacitance variations of said MOSFET.

6. The dual current source MOSFET turn-on/off circuit including noise spike elimination according to claim 1 wherein said MOSFET is a P-channel MOSFET, said first bipolar transistor is a PNP transistor and said second bipolar transistor is an NPN transistor.

* * * * *

UNITED STATES PATENT AND TRADEMARK OFFICE
CERTIFICATE OF CORRECTION

PATENT NO. : 4,890,021

DATED : December 26, 1989

INVENTOR(S) : Charles S. Walker

It is certified that error appears in the above-identified patent and that said Letters Patent is hereby corrected as shown below:

Figures 1-3 should be deleted to be replaced with the attached Figures 1-11 as per attached sheets.

Signed and Sealed this

Nineteenth Day of March, 1991

Attest:

HARRY F. MANBECK, JR.

Attesting Officer

Commissioner of Patents and Trademarks